(12) United States Patent
Lee et al.

(10) Patent No.: US 12,142,189 B2
(45) Date of Patent: Nov. 12, 2024

(54) DISPLAY DEVICE AND DISPLAY PANEL

(71) Applicant: LG Display Co., Ltd., Seoul (KR)

(72) Inventors: ChoongHoon Lee, Gyeonggi-do (KR); Jisoo Lee, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/472,035

(22) Filed: Sep. 21, 2023

(65) Prior Publication Data

US 2024/0257704 A1  Aug. 1, 2024

(30) Foreign Application Priority Data

Jan. 31, 2023  (KR) .................. 10-2023-0013026

(51) Int. Cl.
| | |
|---|---|
| *G09G 3/20* | (2006.01) |
| *G09G 3/3233* | (2016.01) |
| *H10K 59/121* | (2023.01) |
| *H10K 59/124* | (2023.01) |
| *H10K 59/131* | (2023.01) |

(52) U.S. Cl.
CPC ......... *G09G 3/2096* (2013.01); *G09G 3/3233* (2013.01); *H10K 59/1213* (2023.02); *H10K 59/124* (2023.02); *H10K 59/131* (2023.02); *G09G 2300/0426* (2013.01); *G09G 2300/0452* (2013.01); *G09G 2300/0819* (2013.01); *G09G 2300/0842* (2013.01); *G09G 2310/0262* (2013.01); *G09G 2320/0233* (2013.01); *G09G 2320/0247* (2013.01); *G09G 2320/041* (2013.01)

(58) Field of Classification Search
None
See application file for complete search history.

(56) References Cited

U.S. PATENT DOCUMENTS

2024/0057417 A1*  2/2024  Bang .................. H10K 59/1315

* cited by examiner

*Primary Examiner* — Nicholas J Lee
(74) *Attorney, Agent, or Firm* — Seed IP Law Group LLP

(57) ABSTRACT

A display device includes a display panel including a plurality of first, second, third subpixels, a data driving circuit supplying data voltages to the display panel, a gate driving circuit supplying gate signals to the display panel, and a timing controller controlling the data driving circuit and the gate driving circuit. Each of the first subpixels and the second subpixels includes a first conductive electrode positioned to overlap a first node of a first driving transistor driving a first light emitting element, over the first driving transistor, a data voltage applied to the first node of the first driving transistor. The third subpixels include a second conductive electrode positioned to not overlap a first node of a second driving transistor driving a second light emitting element, over the second driving transistor, a data voltage applied to the first node of the second driving transistor.

22 Claims, 10 Drawing Sheets

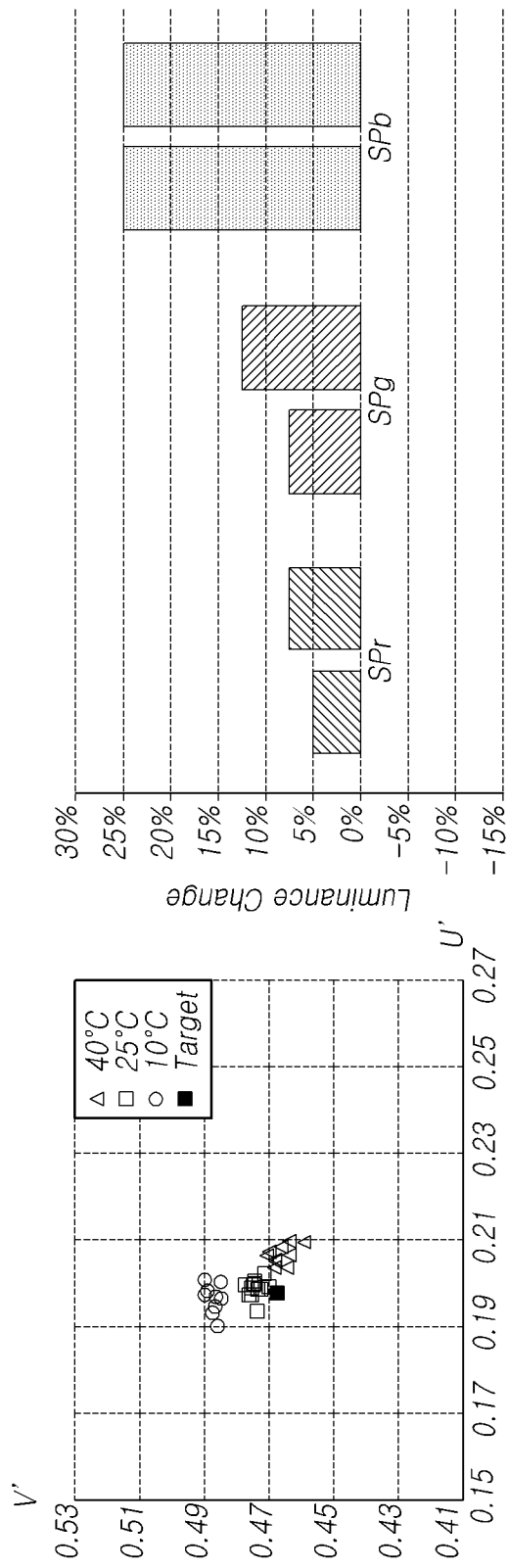

DISPLAY DEVICE AND DISPLAY PANEL

CROSS-REFERENCE TO RELATED APPLICATION

This application claims priority from Korean Patent Application No. 10-2023-0013026, filed on Jan. 31, 2023, which is hereby incorporated by reference for all purposes as if fully set forth herein.

BACKGROUND

Technical Field

Embodiments of the disclosure relate to a display device and a display panel and, more specifically, to a display device and a display panel capable of mitigating luminance deviation between subpixels due to a temperature change.

Description of Related Art

With the development of the information society, various needs for display devices that display images are increasing, and various types of display devices, such as liquid crystal displays (LCDs), organic light emitting displays (OLEDs), etc., are being utilized.

Among these display devices, the organic light emitting display device uses self-emissive organic light emitting diodes, providing advantages, such as a fast response and better contrast ratio, luminous efficiency, luminance, and viewing angle.

The organic light emitting display device may include organic light emitting diodes respectively arranged in a plurality of subpixels disposed on a display panel and cause the organic light emitting diodes to emit light by controlling the current flowing to the organic light emitting diodes, thereby displaying images while controlling the luminance of each subpixel.

BRIEF SUMMARY

The display panel is composed of a plurality of pixels including subpixels of different colors and may cause degradation of image quality due to a different subpixel luminance deviation per color depending on a temperature change. Thus, the inventors of the disclosure have invented, among others, a display device and a display panel capable of mitigating the luminance deviation between subpixels due to a temperature change.

Embodiments of the disclosure may provide a display device and a display panel capable of mitigating the luminance deviation due to a temperature change between subpixels by changing the luminance variation range depending on temperature for the subpixels of some colors.

Embodiments of the disclosure may provide a display device and a display panel capable of mitigating the luminance deviation due to a temperature change between subpixels by changing the capacitance of the driving transistor for the subpixels for some colors.

Embodiments of the disclosure may provide a display device and a display panel capable of mitigating the luminance deviation due to a temperature change between subpixels by dispose the conductive electrode to overlap the source electrode of the driving transistor for the subpixels of some colors.

Embodiments of the disclosure may provide a display device comprising a display panel including a plurality of first subpixels, a plurality of second subpixels, and a plurality of third subpixels, a data driving circuit supplying a plurality of data voltages to the display panel, a gate driving circuit supplying a plurality of gate signals to the display panel, and a timing controller controlling the data driving circuit and the gate driving circuit, wherein each of the plurality of first subpixels and the plurality of second subpixels includes a first conductive electrode positioned to overlap a first node of a first driving transistor driving a first light emitting element, over the first driving transistor, a data voltage applied to the first node of the first driving transistor, and wherein the plurality of third subpixels include a second conductive electrode positioned not to overlap a first node of a second driving transistor driving a second light emitting element, over the second driving transistor, a data voltage applied to the first node of the second driving transistor.

Embodiments of the disclosure may provide a display panel comprising a plurality of first subpixels, a plurality of second subpixels, and a plurality of third subpixels, a plurality of data lines transferring a data voltage to the plurality of subpixels, and a plurality of gate lines transferring a gate signal to the plurality of subpixels, wherein each of the plurality of first subpixels and the plurality of second subpixels includes a first conductive electrode positioned to overlap a first node of a first driving transistor driving a first light emitting element, over the first driving transistor, a data voltage applied to the first node of the first driving transistor, and wherein the plurality of third subpixels include a second conductive electrode positioned to not overlap a first node of a second driving transistor driving a second light emitting element, over the second driving transistor, a data voltage applied to the first node of the second driving transistor.

According to embodiments of the disclosure, it is possible to mitigate the luminance deviation between subpixels due to a temperature change.

According to embodiments of the disclosure, it is possible to mitigate the luminance deviation due to a temperature change between subpixels by changing the luminance variation range depending on temperature for the subpixels of some colors.

According to embodiments of the disclosure, it is possible to mitigate the luminance deviation due to a temperature change between subpixels by changing the capacitance of the driving transistor for the subpixels for some colors.

According to embodiments of the disclosure, it is possible to mitigate the luminance deviation due to a temperature change between subpixels by dispose the conductive electrode to overlap the source electrode of the driving transistor for the subpixels of some colors.

DESCRIPTION OF THE SEVERAL VIEWS OF THE DRAWINGS

The above and other objects, features, and advantages of the disclosure will be more clearly understood from the following detailed description, taken in conjunction with the accompanying drawings, in which:

FIGS. 10A and 10B show an experimental result for a luminance deviation of a display panel depending on temperature in a display device according to embodiments of the disclosure.

DETAILED DESCRIPTION

Figure 1:
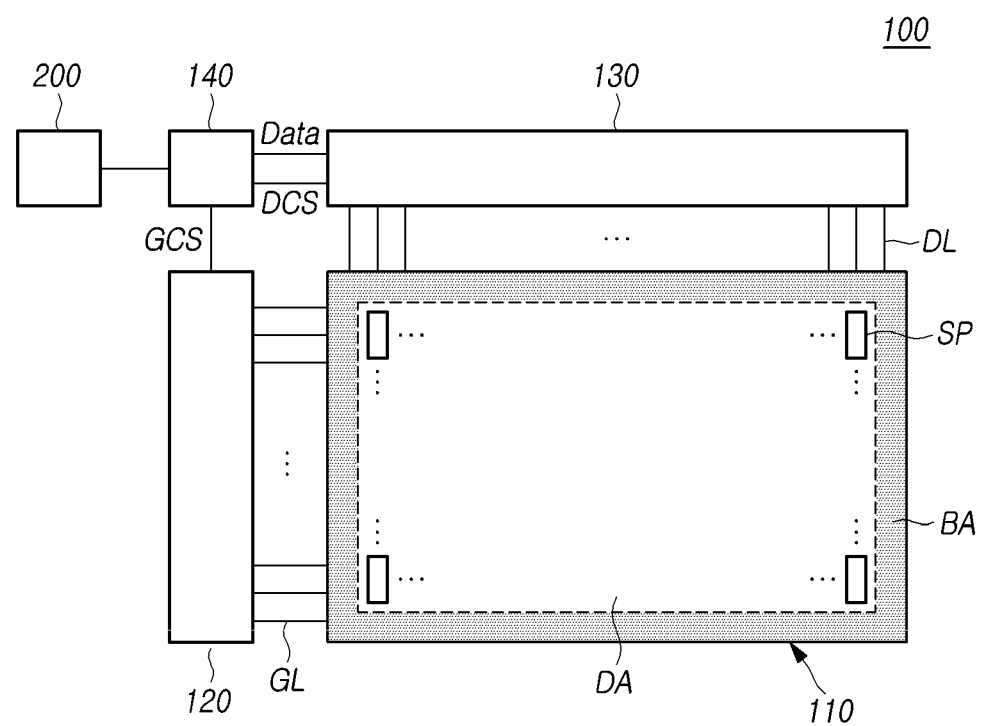
FIG. 1 is a view schematically illustrating a display device according to embodiments of the disclosure.

Hereinafter, some embodiments of the disclosure will be described in detail with reference to exemplary drawings. In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including," "having," "containing," "constituting," "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the disclosure will be described in detail with reference to the accompanying drawings.

FIG. 1 is a view schematically illustrating a display device according to embodiments of the disclosure.

Referring to FIG. 1, a display device 100 according to embodiments of the disclosure may include a display panel 110 and a driving circuit for driving the display panel 110.

The display panel 110 may include a display area DA in which images are displayed and a bezel area BA in which no image is displayed. The bezel area BA may also be referred to as a non-display area.

The display panel 110 may include a plurality of subpixels SP for displaying images. For example, a plurality of subpixels SP may be disposed in the display area DA. In some cases, at least one subpixel SP may be disposed in the bezel area BA. At least one subpixel SP disposed in the bezel area BA is also referred to as a dummy subpixel.

The display panel 110 may include a plurality of signal lines for driving a plurality of subpixels SP. For example, the plurality of signal lines may include a plurality of data lines DL and a plurality of gate lines GL. The signal lines may further include other signal lines than the plurality of data lines DL and the plurality of gate lines GL according to the structure of the subpixel SP. For example, the other signal lines may include driving voltage lines and reference voltage lines.

The plurality of data lines DL and the plurality of gate lines GL may cross each other. Each of the plurality of data lines DL may be disposed while extending in a first direction. Each of the plurality of gate lines GL may be disposed while extending in a second direction. Here, the first direction may be a column direction and the second direction may be a row direction. In the disclosure, the column direction and the row direction are relative. For example, the column direction may be a vertical direction and the row direction may be a horizontal direction. As another example, the column direction may be a horizontal direction and the row direction may be a vertical direction.

The driving circuit may include a data driving circuit 130 for driving a plurality of data lines DL and a gate driving circuit 120 for driving a plurality of gate lines GL. The driving circuit may further include a timing controller 140 for controlling the data driving circuit 130 and the gate driving circuit 120.

The data driving circuit 130 is a circuit for driving the plurality of data lines DL, and may output data signals (also referred to as data voltages) corresponding to image signals to the plurality of data lines DL. The gate driving circuit 120 is a circuit for driving the plurality of gate lines GL and may generate gate signals, and output the gate signals to the plurality of gate lines GL. The gate signal may include one or more scan signals and light emission signals.

The timing controller 140 may start a scan according to the timing implemented in each frame and may control data driving at an appropriate time according to the scan. The timing controller 140 may convert input image data input from the outside to suit the data signal format used by the data driving circuit 130 and supply the converted image data DATA to the data driving circuit 130.

The timing controller 140 may receive display driving control signals, along with input image data, from an external host system 200. For example, the display driving control signals may include a vertical synchronizing signal, a horizontal synchronizing signal, an input data enable signal, and a clock signal.

The timing controller 140 may generate the data driving control signal DCS and the gate driving control signal GCS based on display driving control signals input from the host system 200. The timing controller 140 may control the driving operation and driving timing of the data driving circuit 130 by supplying the data driving control signal DCS to the data driving circuit 130. The timing controller 140 may control the driving operation and driving timing of the gate driving circuit 120 by supplying the gate driving control signal GCS to the gate driving circuit 120.

The data driving circuit 130 may include one or more source driving integrated circuits SDIC. Each source driving integrated circuit may include a shift register, a latch circuit, a digital to analog converter (DAC), an output buffer, and the like. In some cases, each source driving integrated circuit may further include an analog to digital converter (ADC).

For example, each source driving integrated circuit may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 120 may output a gate signal of a turn-on level voltage or a gate signal of a turn-off level voltage according to the control of the timing controller 140. The gate driving circuit 120 may sequentially drive the plurality of gate lines GL by sequentially supplying gate signals of the turn-on level voltage to the plurality of gate lines GL.

The gate driving circuit 120 may include one or more gate driving integrated circuits GDIC.

The gate driving circuit 120 may be connected with the display panel 110 by TAB method or connected to a bonding pad of the display panel 110 by a COG or COP method or may be connected with the display panel 110 according to a COF method. Alternatively, the gate driving circuit 120 may be formed, in a gate in panel (GIP) type, in the bezel area BA of the display panel 110. The gate driving circuit 120 may be disposed on the substrate or may be connected to the substrate. In other words, the gate driving circuit 120 that is of a GIP type may be disposed in the bezel area BA of the substrate. The gate driving circuit 120 that is of a chip-on-glass (COG) type or chip-on-film (COF) type may be connected to the substrate.

Meanwhile, at least one of the data driving circuit 130 and the gate driving circuit 120 may be disposed in the display area DA. For example, at least one of the data driving circuit 130 and the gate driving circuit 120 may be disposed not to overlap the subpixels SP or to overlap all or some of the subpixels SP.

The data driving circuit 130 may be connected to one side (e.g., an upper or lower side) of the display panel 110. Depending on the driving scheme or the panel design scheme, the data driving circuit 130 may be connected with both sides (e.g., upper and lower sides) of the self-emission display panel 110, or two or more of the four sides of the self-emission display panel 110.

The gate driving circuit 120 may be connected with one side (e.g., a left or right side) of the display panel 110. Depending on the driving scheme or the panel design scheme, the gate driving circuit 120 may be connected with both sides (e.g., left and right sides) of the display panel 110, or two or more of the four sides of the display panel 110.

The timing controller 140 may be implemented as a separate component from the data driving circuit 130, or the timing controller 140 and the data driving circuit 130 may be integrated into an integrated circuit (IC). The timing controller 140 may be a controller used in typical display technology or a control device that may perform other control functions as well as the functions of the timing controller, or a circuit in the control device. The timing controller 140 may be implemented as various circuits or electronic components, such as an integrated circuit (IC), a field programmable gate array (FPGA), an application specific integrated circuit (ASIC), or a processor.

The timing controller 140 may be mounted on a printed circuit board or a flexible printed circuit and may be electrically connected with the data driving circuit 130 and the gate driving circuit 120 through the printed circuit board or the flexible printed circuit. The timing controller 140 may transmit/receive signals to/from the data driving circuit 130 according to one or more predetermined interfaces. The interface may include, e.g., a low voltage differential signaling (LVDS) interface, an EPI interface, and a serial peripheral interface (SP).

The display device 100 according to embodiments of the disclosure may be a self-emissive display device in which the display panel 110 emits light by itself. When the display device 100 according to the embodiments of the disclosure is a self-emissive display device, each of the plurality of subpixels SP may include a light emitting element. For example, the display device 100 according to embodiments of the disclosure may be an organic light emitting diode display in which the light emitting element is implemented as an organic light emitting diode (OLED). As another example, the display device 100 according to embodiments of the disclosure may be an inorganic light emitting display device in which the light emitting element is implemented as an inorganic material-based light emitting diode. As another example, the display device 100 according to embodiments of the disclosure may be a quantum dot display device in which the light emitting element is implemented as a quantum dot which is self-emission semiconductor crystal.

Figure 2:
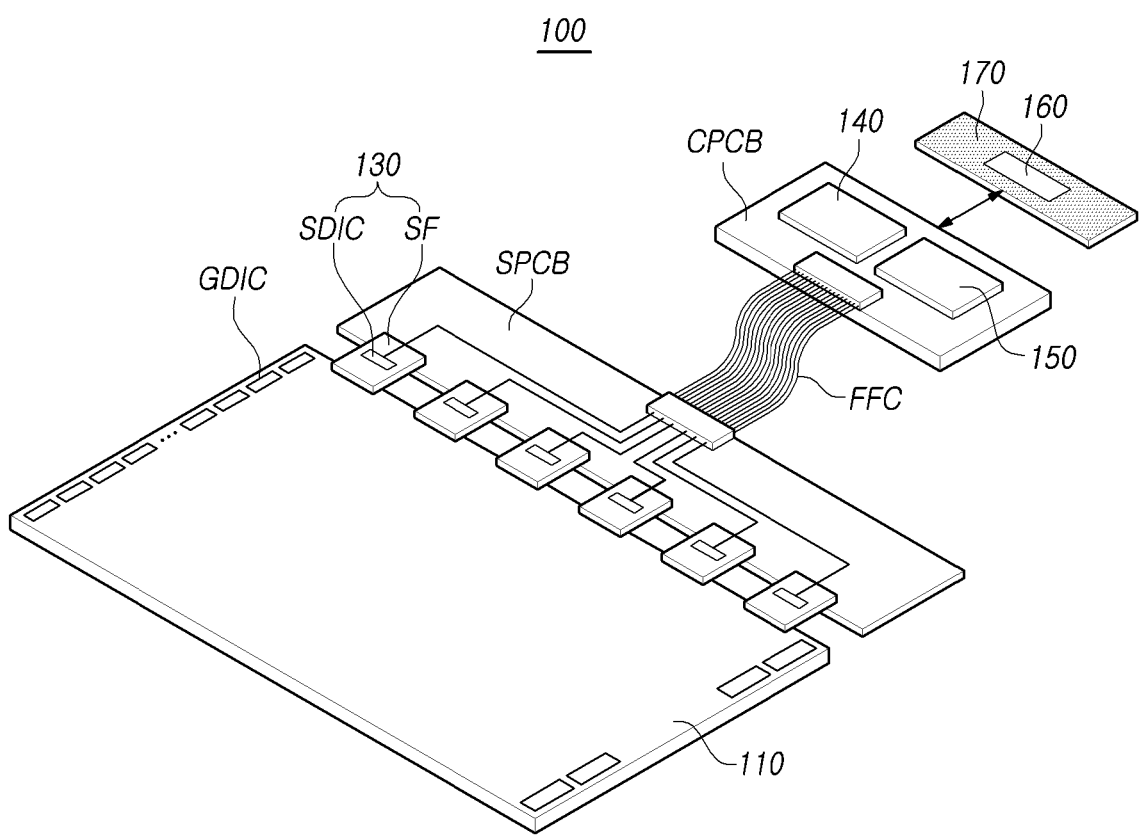
FIG. 2 is a system example view illustrating a display device according to embodiments of the disclosure.

FIG. 2 is a system example view illustrating a display device according to embodiments of the disclosure.

FIG. 2 illustrates an example in which in the display device 100 according to embodiments of the disclosure, the data driving circuit 130 is implemented by a chip on film (COF) type among various types (e.g., TAB, COG, and COF), and the gate driving circuit 120 is implemented by a gate in panel (GIP) type among various types (e.g., TAB, COG, COF, and GIP).

When the gate driving circuit 120 is implemented in the GIP type, the plurality of gate driving integrated circuits GDIC included in the gate driving circuit 120 may be directly formed in the bezel area of the display panel 110. In this case, the gate driving integrated circuits GDIC may receive various signals (e.g., a clock, a gate high signal, a gate low signal, etc.) necessary for generating scan signals through gate driving-related signal lines disposed in the bezel area.

Likewise, one or more source driving integrated circuits SDIC included in the data driving circuit 130 each may be mounted on the source film SF, and one side of the source film SF may be electrically connected with the display panel 110. Lines for electrically connecting the source driver integrated circuit SDIC and the display panel 110 may be disposed on the source film SF.

The display device 100 may include at least one source printed circuit board SPCB for circuit connection between a plurality of source driving integrated circuits SDIC and other devices and a control printed circuit board CPCB for mounting control components and various electric devices.

The other side of the source film SF where the source driving integrated circuit SDIC is mounted may be connected to at least one source printed circuit board SPCB. In other words, one side of the source film SF where the source driving integrated circuit SDIC is mounted may be electrically connected with the display panel 110, and the other side thereof may be electrically connected with the source printed circuit board SPCB.

The timing controller 140 and the power management circuit 150 may be mounted on the control printed circuit board CPCB. The timing controller 140 may control the operation of the data driving circuit 130 and the gate driving circuit 120. The power management circuit 150 may supply driving voltage or current to the display panel 110, the data driving circuit 130, and the gate driving circuit 120 and control the supplied voltage or current.

At least one source printed circuit board SPCB and control printed circuit board CPCB may be circuit-connected through at least one connection member. The connection member may include, e.g., a flexible printed circuit FPC or a flexible flat cable FFC. The at least one source printed circuit board SPCB and control printed circuit board CPCB may be integrated into a single printed circuit board.

The display device 100 may further include a set board 170 electrically connected to the control printed circuit board CPCB. In this case, the set board 170 may also be referred to as a power board. A main power management circuit 160 for managing the overall power of the display device 100 may be present on the set board 170. The main power management circuit 160 may interwork with the power management circuit 150.

In the so-configured display device 100, the driving voltage is generated in the set board 170 and transferred to the power management circuit 150 in the control printed circuit board CPCB. The power management circuit 150 transfers a driving voltage necessary for display driving or characteristic value sensing to the source printed circuit board SPCB through the flexible printed circuit FPC or flexible flat cable FFC. The driving voltage transferred to the source printed circuit board SPCB is supplied to emit light or sense a specific subpixel SP in the display panel 110 through the source driving integrated circuit SDIC.

Each of the subpixels SP arranged in the display panel 110 in the display device 100 may include a light emitting element and a circuit element, e.g., a driving transistor, for driving the organic light emitting diode.

The type and number of circuit elements constituting each subpixel SP may be varied depending on functions to be provided and design schemes.

Figure 3:
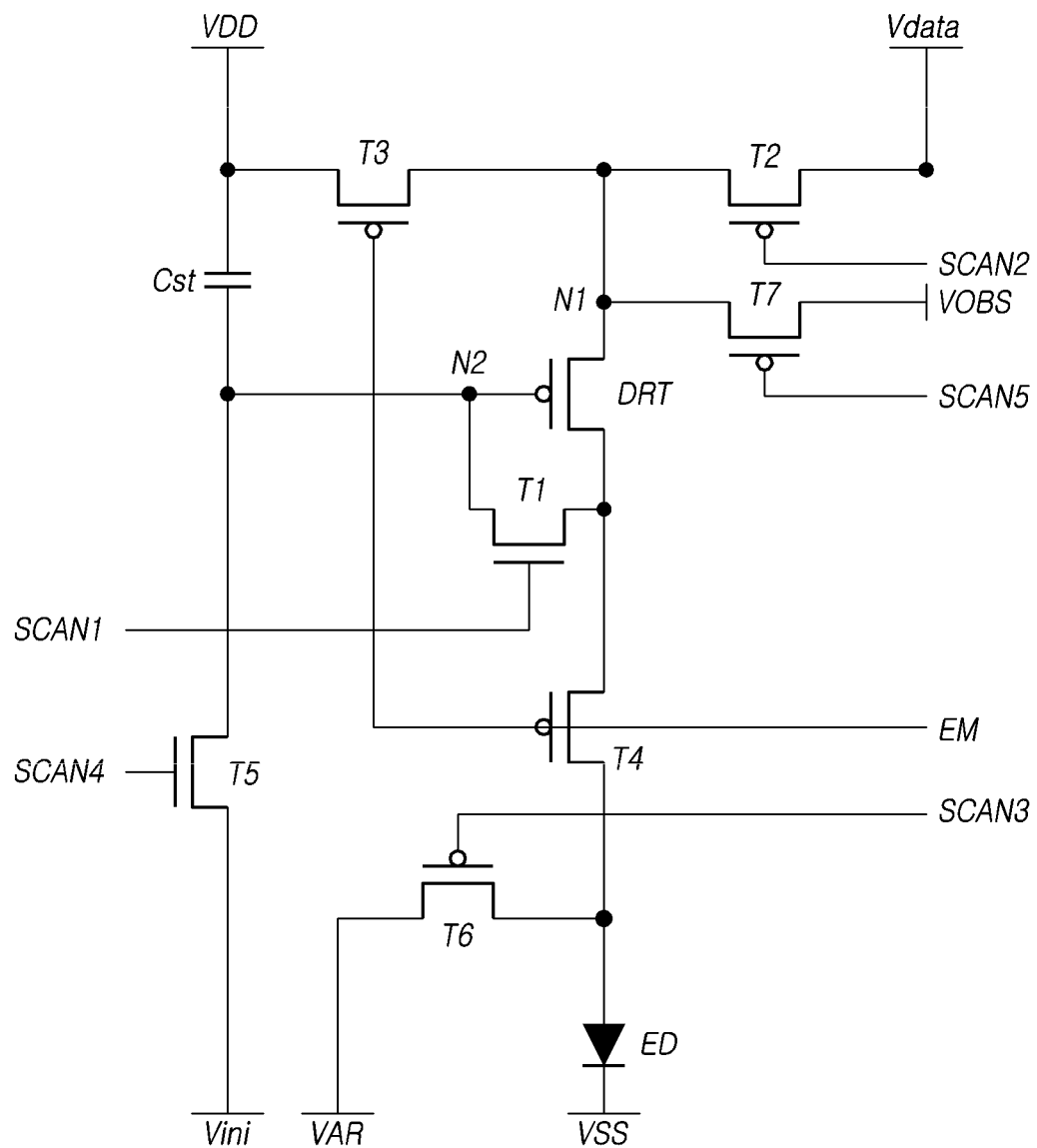
FIG. 3 is a view illustrating an example of a subpixel circuit of a display device according to embodiments of the disclosure.

FIG. 3 is a view illustrating an example of a subpixel circuit of a display device according to embodiments of the disclosure.

Referring to FIG. 3, the subpixel SP of the display device 100 according to embodiments of the disclosure may include first to seventh switching transistors T1 to T7, a driving transistor DRT, a storage capacitor Cst, and a light emitting element ED.

Here, the light emitting element ED may be, e.g., a self-emissive light emitting element, such as an organic light emitting diode OLED.

According to an embodiment of the disclosure, in the subpixel SP, the second to fourth switching transistors T2 to T4, the sixth switching transistor T6, the seventh switching transistor T7, and the driving transistor DRT may be P-type transistors. Further, the first switching transistor T1 and the fifth switching transistor T5 may be N-type transistors.

The P-type transistor is relatively more reliable in providing a stable high voltage potential than the N-type transistor. In the P-type transistor, since the source electrode may be fixed to the high-potential driving voltage VDD during light emission, the current flowing through the light emitting element ED is remains more stable and is not affected by the capacitor Cst. Therefore, it is more reliable to supply current stably.

When connected to the anode electrode of the light emitting element ED to operate in the saturation area, the P-type transistor may flow a constant current regardless of a change in the threshold voltage, providing relatively high reliability.

In the subpixel SP structure, the N-type transistors T1 and T5 may be an oxide transistor formed of an oxide semiconductor (e.g., a transistor having a channel formed from an oxide semiconductor, such as indium, gallium, zinc oxide, or IGZO). The P-type transistors DRT, T2-T4, T6, and T7 may be a low-temperature polysilicon transistor formed from a semiconductor, such as silicon (e.g., a transistor having a polysilicon channel formed by a low-temperature process referred to as low-temperature polysilicon (LTPS)).

Since the oxide transistor has a relatively lower leakage current than the silicon transistor, when the transistor is implemented as an oxide transistor, leakage of current from the gate electrode N2 of the driving transistor DRT may be prevented, reducing image quality defects, such as flicker.

Meanwhile, the remaining P-type transistors DRT, T2-T4, T6, and T7 except for the first switching transistor T1 and the fifth switching transistor T5 corresponding to N-type transistors may be formed of low-temperature polysilicon.

Here, the terms "source electrode" and "drain electrode" for the transistor may be interchangeably used depending on the input voltage.

The gate electrode of the first switching transistor T1 receives the first scan signal SCAN1. The drain electrode of the first switching transistor T1 is connected to the gate electrode N2 of the driving transistor DRT. Further, the source electrode of the first switching transistor T1 is connected to the drain electrode of the driving transistor DRT.

The first switching transistor T1 may be turned on by the first scan signal SCAN1 and keeps the gate voltage of the driving transistor DRT constant by the storage capacitor Cst having one terminal fixed to the high-potential driving voltage VDD.

The first switching transistor T1 may be formed of an N-type MOS transistor to form an oxide transistor. Since the N-type MOS transistor uses electrons, not holes, as carriers, it has higher mobility than the P-type MOS transistor and may thus have a high switching speed.

The gate electrode of the second switching transistor T2 receives the second scan signal SCAN2. The source electrode of the second switching transistor T2 may receive the data voltage Vdata. The drain electrode of the second switching transistor T2 is connected to the source electrode N1 of the driving transistor DRT.

The second switching transistor T2 may be turned on by the second scan signal SCAN2 and supply the data voltage Vdata to the source electrode N1 of the driving transistor DRT.

The gate electrode of the third switching transistor T3 receives a light emission signal EM. The source electrode of the third switching transistor T3 receives the high-potential driving voltage VDD. The drain electrode of the third switching transistor T3 is connected to the source electrode N1 of the driving transistor DRT.

The third switching transistor T3 is turned on by the light emission signal EM and supplies the high-potential driving voltage VDD to the source electrode N1 of the driving transistor DRT.

The gate electrode of the fourth switching transistor T4 receives a light emission signal EM. The source electrode of the fourth switching transistor T4 is connected to the drain electrode of the driving transistor DRT. The drain electrode of the fourth switching transistor T4 is connected to the anode electrode of the light emitting element ED.

The fourth switching transistor T4 is turned on by the light emission signal EM and supplies a driving current to the anode electrode of the light emitting element ED.

The gate electrode of the fifth switching transistor T5 receives the fourth scan signal SCAN4.

Here, the fourth scan signal SCAN4 may have a different phase from the first scan signal SCAN1 supplied to the subpixel SP in another position. For example, when the first scan signal SCAN1 is applied to the nth gate line, the fourth scan signal SCAN4 may use the first scan signal SCAN1 [n−1] applied to the n−1th gate line. In other words, the fourth scan signal SCAN4 may use the first scan signal SCAN1 that varies the gate line GL according to the driving phase of the display panel 110.

The drain electrode of the fifth switching transistor T5 receives a stabilization voltage Vini. The source electrode of the fifth switching transistor T5 is connected to the gate electrode N2 of the driving transistor DRT and the storage capacitor Cst.

The fifth switching transistor T5 is turned on by the fourth scan signal SCAN4 and supplies the stabilization voltage Vini to the gate electrode N2 of the driving transistor DRT.

The gate electrode of the sixth switching transistor T6 receives the third scan signal SCAN3.

The source electrode of the sixth switching transistor T6 receives the reset voltage VAR. The drain electrode of the sixth switching transistor T6 is connected to the anode electrode of the light emitting element ED.

The sixth switching transistor T6 is turned on by the third scan signal SCAN3 and supplies the reset voltage VAR to the anode electrode of the light emitting element ED.

The gate electrode of the seventh switching transistor T7 receives the fifth scan signal SCAN5.

The source electrode of the seventh switching transistor T7 receives the bias voltage VOBS. The drain electrode of the seventh switching transistor T7 is connected to the source electrode N1 of the driving transistor DRT.

Here, the fifth scan signal SCAN5 may have a different phase from the third scan signal SCAN3 supplied to the subpixel SP in another position. For example, when the third scan signal SCAN3 is applied to the nth gate line, the fifth scan signal SCAN5 may be the third scan signal SCAN3 applied to the n−1th gate line. In other words, the fifth scan signal SCAN5 may use the third scan signal SCAN3 that varies the gate line GL according to the driving phase of the display panel 110.

Meanwhile, since the fifth scan signal SCAN5 is a signal for applying the bias voltage VOBS to the driving transistor DRT, it is preferable to distinguish it from the second scan signal SCAN2 for applying the data voltage Vdata.

The gate electrode N2 of the driving transistor DRT is connected to the drain electrode of the first switching transistor T1. The source electrode N1 of the driving transistor DRT is connected to the drain electrode of the second switching transistor T2. The drain electrode of the driving transistor DRT is connected to the source electrode of the first switching transistor T1.

The driving transistor DRT is turned on by a voltage difference between the gate electrode N2 and the source electrode N1, and a driving current is applied to the light emitting element ED.

The source electrode and the drain electrode of the first switching transistor T1 may be connected to the drain electrode and the gate electrode, respectively, of the driving transistor DRT. The operation of sampling and compensating for the threshold voltage of the driving transistor DRT may be performed by the data voltage Vdata applied to the source electrode N1 of the driving transistor DRT in the turned-on state of the first switching transistor T1.

One electrode of the storage capacitor Cst may be supplied with the high-potential driving voltage VDD, and the other electrode is connected to the gate electrode N2 of the driving transistor DRT. The storage capacitor Cst stores the voltage of the gate electrode N2 of the driving transistor DRT.

The anode electrode of the light emitting element ED is connected to the drain electrode of the fourth switching transistor T4 and the drain electrode of the sixth switching transistor T6. A low-potential driving voltage VSS is applied to the cathode electrode of the light emitting element ED.

The light emitting element ED emits light with a predetermined brightness by a driving current flown by the driving transistor DRT.

In this case, the stabilization voltage Vini is supplied to stabilize a change in capacitance formed on the gate electrode N2 of the driving transistor DRT, and the reset voltage VAR is supplied to reset the anode electrode of the light emitting element ED.

When the reset voltage VAR is supplied to the anode electrode of the light emitting element ED in the turned-off state of the fourth switching transistor T4 positioned between the anode electrode of the light emitting element ED and the driving transistor DRT and controlled by the light emitting signal EM, the anode electrode of the light emitting element ED may be reset.

The sixth switching transistor T6 for supplying the reset voltage VAR is connected to the anode electrode of the light emitting element ED.

The fourth scan signal SCAN4 for driving the driving transistor DRT or stabilizing the driving transistor DRT and the third scan signal SCAN3 for controlling the supply of the reset voltage VAR to the anode electrode of the light emitting element ED are separated from each other so that the driving operation of the driving transistor DRT and the operation of resetting the anode electrode are separately performed.

In this case, the subpixel SP may be configured to turn off the fourth switching transistor T4, which connects the drain electrode of the driving transistor DRT and the anode electrode of the light emitting element ED, to block flow of the driving current of the driving transistor DRT to the anode electrode of the light emitting element ED while not affecting the anode electrode by other voltages than the reset voltage VAR, upon turning on the switching transistors T5 and T6 supplying the stabilization voltage Vini and the reset voltage VAR.

As such, the subpixel SP including eight transistors DRT, T1, T2, T3, T4, T5, T6, and T7 and one storage capacitor Cst may be referred to as having an 8T1C structure.

Here, the 8T1C structure is shown as an example among various structures of subpixel SP circuits, and the structure and number of transistors and capacitors constituting the subpixel SP may be varied. Meanwhile, the plurality of subpixels SP may have the same structure, or some of the plurality of subpixels SP may have a different structure.

A plurality of pixels may be disposed in a predetermined arrangement on the display panel 110. Each pixel may include a plurality of subpixels SP that emit light of different colors.

Figure 4:
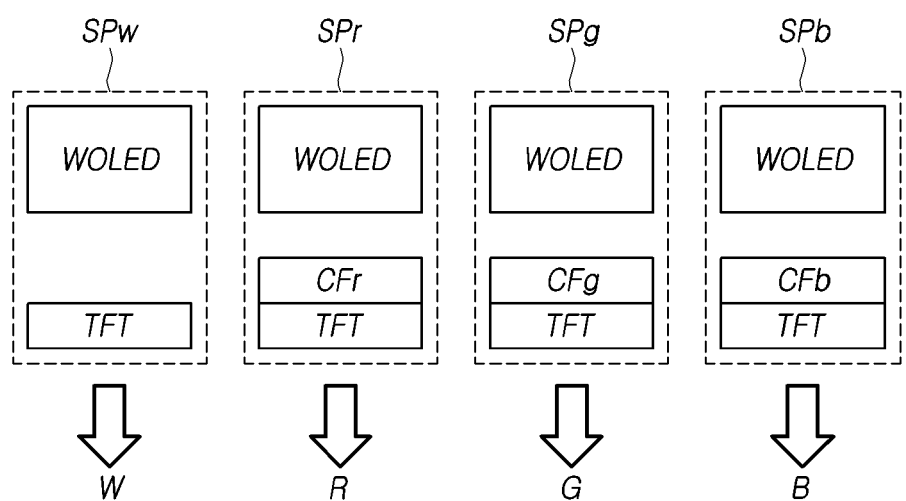
FIG. 4 is a hierarchical diagram illustrating a schematic cross-sectional structure of a pixel including a plurality of subpixels in a display device according to embodiments of the disclosure.

FIG. 4 is a hierarchical diagram illustrating a schematic cross-sectional structure of a pixel including a plurality of subpixels in a display device according to embodiments of the disclosure.

Referring to FIG. 4, in the display device 100 according to embodiments of the disclosure, the display panel 110 may have a pixel structure including a white subpixel SPw, a red subpixel SPr, a green subpixel SPg, and a blue subpixel SPb to prevent degradation of color and pure-color luminance while increasing the optical efficiency. In other words, one pixel may be composed of four subpixels SPw, SPr, SPg, and SPb including a white subpixel SPw, a red subpixel SPr, a green subpixel SPg, and a blue subpixel SPb.

In this case, the RGB subpixels SPr, SPg, and SPb may be referred to as colored subpixels, as distinguished from the white subpixel SPw. The colors of the subpixels SP constituting the pixel are not limited to white, red, green, and blue, and be varied according to the type of the display device 100.

One subpixel SP may include one or more switching transistors, a driving transistor DRT, a storage capacitor Cst, and a light emitting element ED. In the case of an organic light emitting display device, the light emitting element ED is formed of an organic light emitting diode, and operates to emit light according to the driving current formed by the driving transistor DRT.

The subpixel SP may be classified into a top-emission type, a bottom-emission type, or a dual-emission type according to a structure.

The WRGB subpixels SPw, SPr, SPg, and SPb may be implemented in a type in which a white organic light emitting diode (WOLED) and RGB color filters CFr, CFg, and CFb are used, or a type in which the light emitting materials contained in the organic light emitting diode are divided into WRGB colors.

In the type using a white organic light emitting diode (WOLED) and RGB color filters CFr, CFg, and CFb, the RGB subpixels SPr, SPg, and SPb may be formed of one or more transistors TFT, RGB color filters CFr, CFg, and CFb, and a white organic light emitting diode WOLED while the white subpixel SPw may be formed of one or more transistors TFT and a white organic light emitting diode WOLED.

In other words, the RGB subpixels SPr, SPg, and SPb include RGB color filters CFr, CFg, and CFb to convert the white color light transferred from the white organic light emitting diode WOLED into red, green, and blue light. In contrast, the white subpixel SPw may not include a color filter because it emits white light transferred from the white organic light emitting diode WOLED, as it is.

In the type using WRGB subpixels SPw, SPr, SPg, and SPb, a white light emitting material is deposited in all the subpixels SP, thus allowing for manufacture of a large-scale display panel even without using a fine metal mask, along with an increased lifespan and power savings.

The structure of the subpixel SP is described herein by taking an organic light emitting display as an example, but embodiments of the disclosure are not limited to the organic light emitting display, but may rather be applied to any display device white subpixels SPw and colored subpixels.

In the display panel 110 including the colored subpixels SPr, SPg, and SPb, the luminance of the subpixels SP may vary according to temperature due to variations in element characteristics according to driving time.

Figure 5:
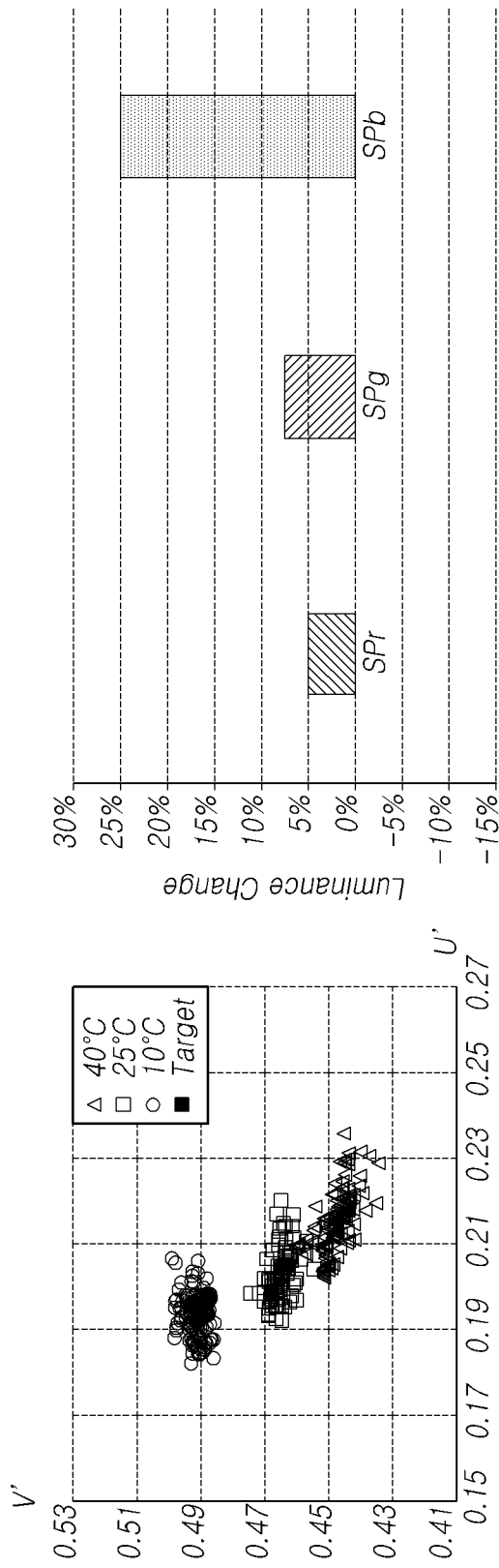
FIGS. 5A and 5B show an experimental result for a luminance deviation of subpixels constituting a display panel depending on temperature.

FIGS. 5A and 5B show an experimental result for a luminance deviation of subpixels constituting a display panel depending on temperature.

Referring to FIGS. 5A and 5B, the luminance of the subpixels SP constituting the display panel 110 may vary according to the temperature of the display panel 110. For example, as in the case of FIG. 5A, as the temperature of the display panel 110 increases from 10 degrees to 40 degrees, the color coordinates of luminance represented by the subpixels SP decrease.

In this case, the luminance deviation may vary according to the color of the subpixel SP. For example, as in the case of FIG. 5B, when the temperature of the display panel 110 rises from 15 degrees to 25 degrees, the luminance variation range of the red subpixel SP is about 5%, the luminance variation range of the green subpixel SPg is about 7%, and the luminance variation range of the blue subpixel SPb is about 25%.

As such, the largest luminance deviation according to temperature appears in the blue subpixel SPb, and small luminance deviations appear in the red subpixel SPr and green subpixel SPg.

As a result, as the temperature increases, the luminance deviation between the blue subpixel SPb and other colored subpixels (red subpixel SPr and green subpixel SP) increases, deteriorating image quality.

The display device 100 of the disclosure may enhance image quality by increasing the luminance variation range of the red subpixel SPr and the green subpixel SPg according to temperature to thereby reduce the luminance deviation from the blue subpixel SPb.

Figure 6:
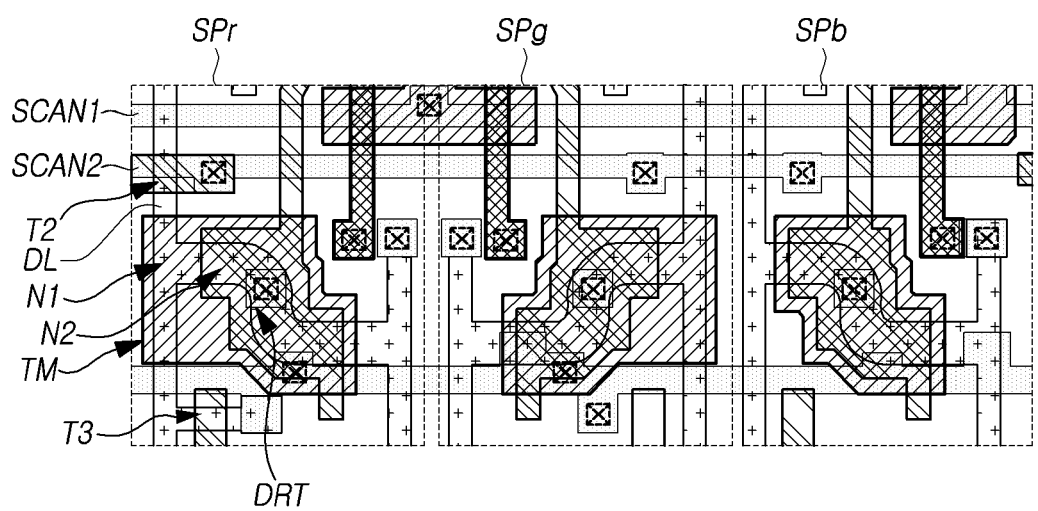
FIG. 6 is a view illustrating an example of a portion of a pixel plane of a display panel in a display device according to embodiments of the disclosure.
Figure 7:
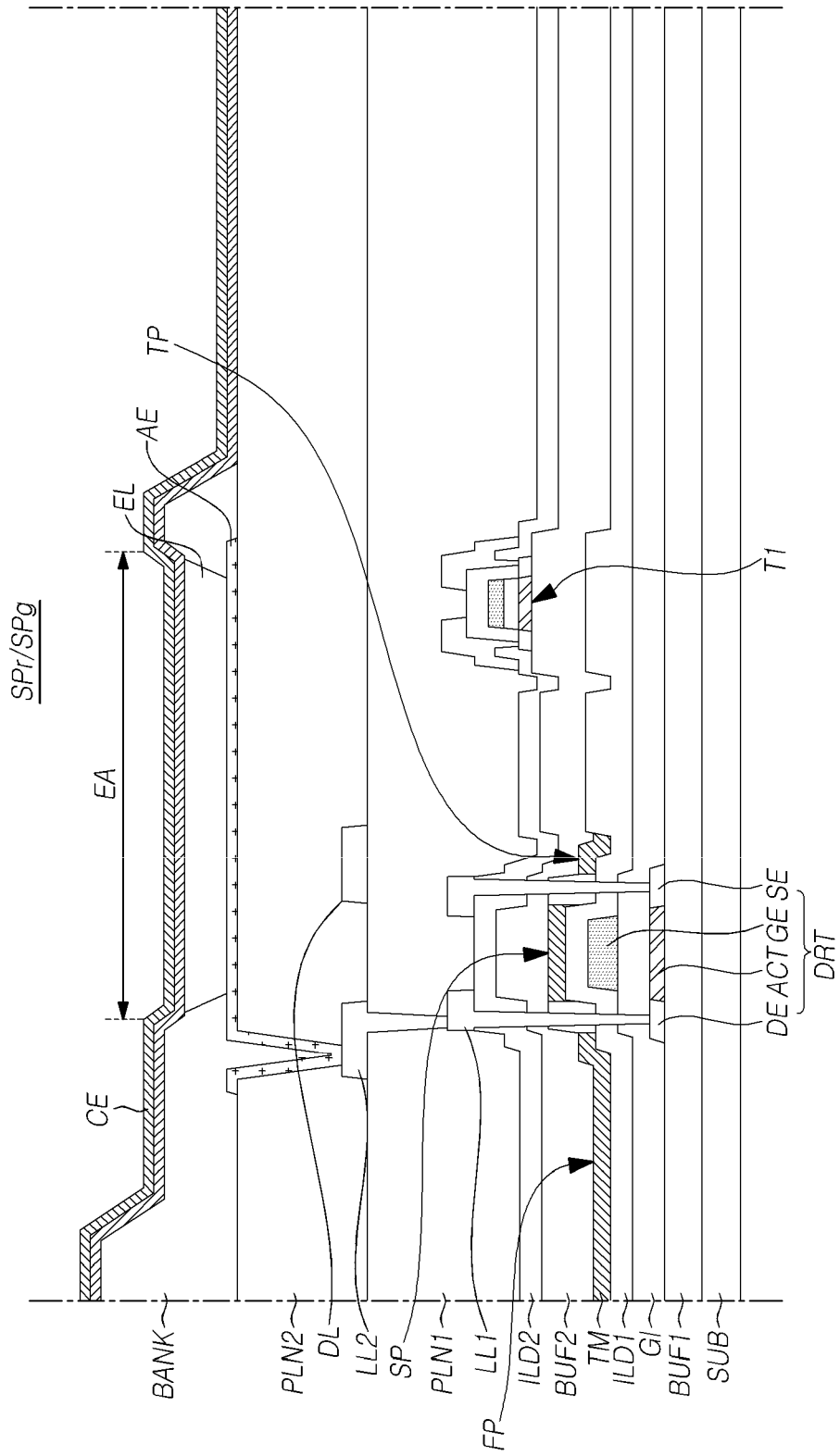
FIG. 7 is a view illustrating an example cross section of a red subpixel and a green subpixel in a touch display device according to embodiments of the disclosure.
Figure 8:
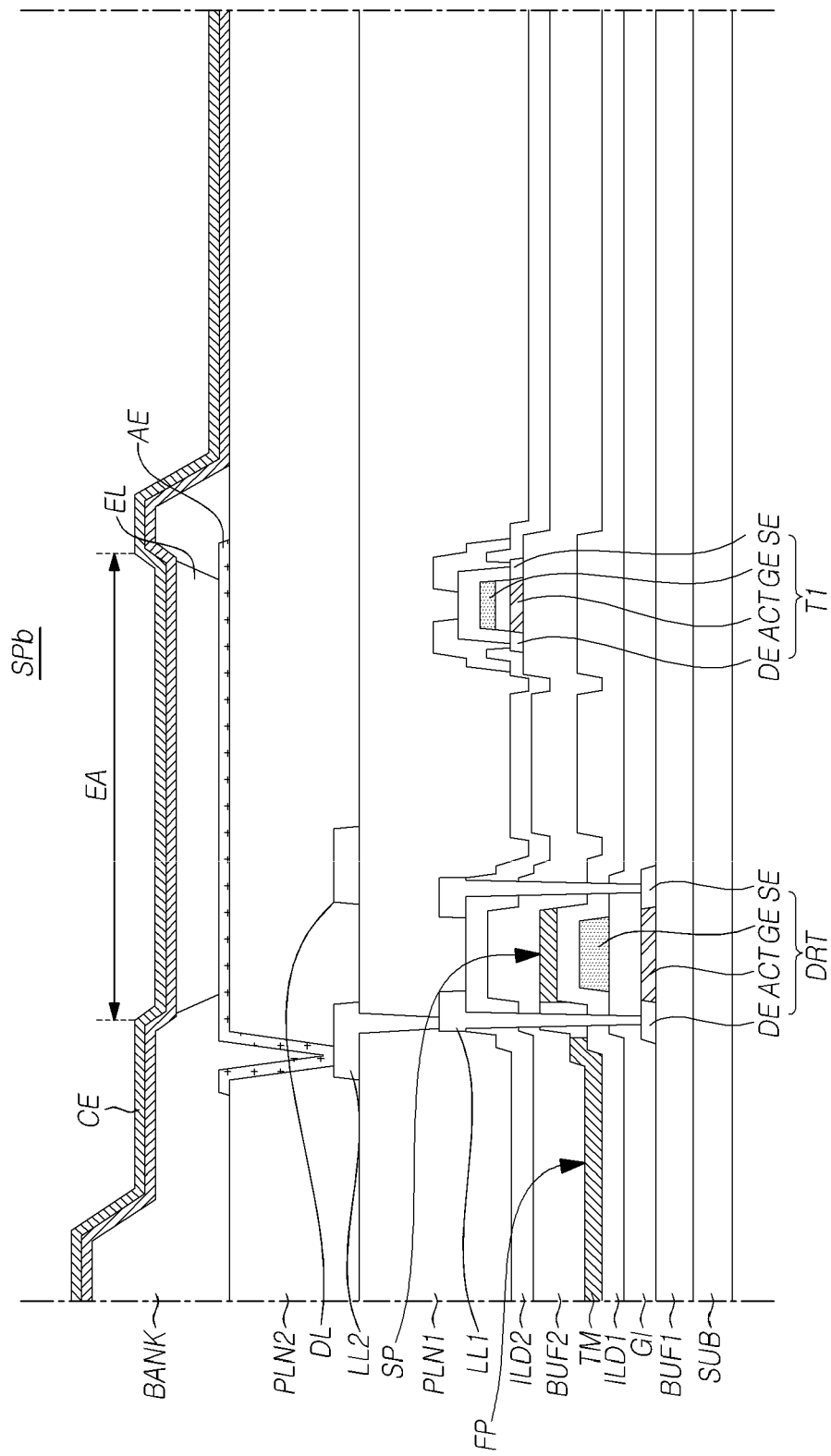
FIG. 8 is a view illustrating an example cross section of a blue subpixel in a touch display device according to embodiments of the disclosure.

FIG. 6 is a view illustrating an example of a portion of a pixel plane of a display panel in a display device according to embodiments of the disclosure. FIG. 7 is a view illustrating an example cross section of a red subpixel and a green subpixel in a touch display device according to embodiments of the disclosure. FIG. 8 is a view illustrating an example cross section of a blue subpixel in a touch display device according to embodiments of the disclosure.

Referring to FIGS. 6 to 8, the display panel 110 of the display device 100 according to embodiments of the disclosure may include a substrate SUB.

A plurality of subpixels SP including a red subpixel SPr, a green subpixel SPg, and a blue subpixel SPb are formed on the substrate SUB. Each of the plurality of subpixels SP may include a light emitting element ED including an anode electrode AE, a light emitting layer EL, and a cathode electrode CE, a driving transistor DRT for driving the light emitting element ED, and a storage capacitor Cst for maintaining the voltage between the gate electrode GE and the source electrode SE (or drain electrode DE) of the driving transistor DRT.

Driving transistors DRT, switching transistors, and capacitors Cst are formed on the substrate SUB. Light emitting elements ED may be formed on the substrate SUB. The drain electrode DE of the driving transistor DRT may be electrically connected to the anode electrode AE of the light emitting element ED. Here, an example where the first switching transistor T1 of the driving transistor DRT is formed is shown.

An encapsulation layer may be formed on the cathode electrode CE of the light emitting elements ED. The encapsulation layer may prevent oxygen or moisture from penetrating into the light emitting elements ED.

A first buffer layer BUF1 may be disposed on the substrate SUB.

A driving transistor DRT may be formed on the first buffer layer BUF1.

The semiconductor layer ACT, the source electrode SE, and the drain electrode DE of the driving transistor DRT may be formed on the first buffer layer BUF1.

A gate insulation film GI may be disposed on the semiconductor layer ACT, the source electrode SE, and the drain electrode DE of the driving transistor DRT.

A gate electrode GE of the driving transistor DRT may be positioned on the gate insulation film GI.

A first inter-layer insulation film ILD1 may be disposed on the gate electrode GE of the driving transistor DRT.

A conductive electrode TM capable of supplying a driving voltage VDD may be formed on the first inter-layer insulation film ILD1. In other words, the conductive electrode TM may correspond to a driving voltage line for supplying the driving voltage VDD to the subpixel SP.

In this case, the conductive electrode TM may be formed of the same material as the gate electrode GE. For example, the conductive electrode TM and the gate electrode GE may be formed of molybdenum (Mo).

In this case, the conductive electrode TM may form a capacitance between it and the source electrode SE of the driving transistor DRT depending on its formed position, so that the luminance variation range of the subpixel SP may be affected.

In particular, since the data voltage Vdata is applied to the source electrode SE of the driving transistor DRT, the luminance variation range may increase as the capacitance formed between the conductive electrode TM and the source electrode SE of the driving transistor DRT increases.

Accordingly, the placement of the conductive electrode TM may be configured to differ depending on the color of the subpixel SP so that the luminance variation range varies according to the color of the subpixel SP.

For example, to reduce the luminance deviation between the subpixels SP, it is beneficial to increase the luminance variation ranges of the red subpixel SPr and the green subpixel SPg while decreasing the luminance variation range of the blue subpixel SPb.

To that end, in the red subpixel SPr and the green subpixel SPg, the conductive electrode TM may be formed to extend up to the position where it overlaps the source electrode SE of the driving transistor DRT as shown in FIG. 7. However, even when the conductive electrode TM extends up to the position where it overlaps the source electrode SE of the driving transistor DRT, the conductive electrode TM is not electrically connected to the source electrode SE of the driving transistor DRT.

As such, when the conductive electrode TM extends up to the position where it overlaps the source electrode SE of the driving transistor DRT, a capacitance is formed between the conductive electrode TM and the source electrode SE of the driving transistor DRT.

To be specific, as shown in FIG. 7, the conductive electrode TM includes three portions, namely, a first portion FP, a second portion SP, and a third portion TP. All three portions FP, SP, TP are part of the conductive electrode TM and therefore are on the same layer as each other. Here, the first portion FP, the second portion SP, and the third portion TP of the conductive electrode TM is on the first inter-layer insulation film ILD1.

In one embodiment, the first portion FP at least partially overlaps with the drain electrode DE of the driving transistor DRT. However, the embodiment is not limited thereto.

The second portion SP at least partially overlaps with the gate electrode GE of the driving transistor DRT. However, as shown in FIG. 7, the second portion SP may fully overlap the gate electrode GE of the driving transistor DRT.

The third portion TP at least partially overlaps with the source electrode SE of the driving transistor DRT. As described, the at least partial overlap between the third portion TP and the source electrode SE of the driving transistor DRT forms a capacitance.

In particular, when the data line DL is positioned above the conductive electrode TM (to be specific, the third portion TP of the conductive electrode TM), a first capacitance is formed between the data line DL and the conductive electrode TM (e.g., the third portion TP of the conductive electrode TM), a second capacitance is formed between the conductive electrode TM (e.g., the third portion TP of the conductive electrode TM) and the source electrode SE of the driving transistor DRT, and a third capacitance is formed between the data line DL and the source electrode SE of the driving transistor DRT, further increasing the capacitance corresponding to the source electrode SE of the driving transistor DRT.

As a result, the capacitance related to the driving of the red subpixel SPr and the green subpixel SPb increases, resulting in an increase in luminance variation range.

In contrast, in the blue subpixel SPb, the conductive electrode TM does not overlap the source electrode SE of the driving transistor DRT as shown in FIG. 8. That is, the third portion TP of the conductive electrode TM that was shown in FIG. 7 is not present in FIG. 8. This is because in order to enhance image quality, it is beneficial to decrease the luminance variation range of the blue subpixel SPb. As a result, the capacitance related to the driving of the blue subpixel SPb becomes smaller than those of the red subpixel SPr and the green subpixel SPb.

As a result, the luminance variation range of the blue subpixel SPb is smaller than the luminance variation ranges of the red subpixel SPr and the green subpixel SPb.

In one embodiment, the first portion FP, the second portion SP, and the third portion TP may be spaced apart from each other. According to one embodiment, each of the first portion FP, the second portion SP, and the third portion TP may be electrically isolated from each other (e.g., electrically disconnected from each other). Here, the first portion FP and the second portion SP are spaced apart from each other so that the first link line LL1 extends through this space and electrically connect with the drain electrode DE of the driving transistor DRT.

Similarly, the third portion TP and the second portion SP are spaced apart from each other so that the first link line LL1 extends through this space and electrically connect with the source electrode SE of the driving transistor DRT.

Here, to distinguish the conductive electrodes formed in the red subpixel SPr and the green subpixel SPg from the conductive electrode formed in the blue subpixel SPb, the conductive electrodes formed in the red subpixel SPr and the green subpixel SPg may be referred to as first conductive electrodes, and the conductive electrode formed in the blue subpixel SPb may be referred to as a second conductive electrode.

Further, a second buffer layer BUF2 may be disposed to cover the conductive electrode TM and the first inter-layer insulation film ILD1.

A first switching transistor T1 may be formed on the second buffer layer BUF2. Here, the first switching transistor T1 is shown as an example among a plurality of switching transistors.

A second inter-layer insulation film ILD2 may be disposed to cover the first switching transistor T1.

The semiconductor layer, source electrode, and drain electrode of the first switching transistor T1 may be disposed on the second inter-layer insulation film ILD2.

A second gate insulation film and the gate electrode of the first switching transistor T1 may be sequentially disposed on the semiconductor layer, the source electrode, and the drain electrode of the first switching transistor T1.

A first link line LL1 connecting the source electrode SE and the drain electrode DE of the driving transistor DRT may be disposed on the second inter-layer insulation film ILD2. Similarly, a first link line connecting the source electrode and the drain electrode of the first switching transistor T1 may be disposed on the second inter-layer insulation film ILD2.

The source electrode SE and the drain electrode DE of the driving transistor DRT may be electrically connected to the first link line LL1 through a contact hole of the second inter-layer insulation film ILD2.

A first planarization layer PLN1 may be disposed while covering the first link line LL1 formed on the second inter-layer insulation film ILD2.

A second link line LL2 that transfers driving current to the light emitting element ED and a data line DL that transfers the data voltage Vdata may be disposed on the first planarization layer PLN1. The second link line LL2 and the data line DL may be formed of the same material as the source electrode SE or drain electrode DE of the driving transistor DRT.

The second link line LL2 may be formed to electrically connect the source electrode SE or drain electrode DE of the driving transistor DRT and the anode electrode AE of the light emitting element ED and may be disposed in a position where it overlaps the anode electrode AE.

A second planarization layer PLN2 may be disposed on the first planarization layer PLN1 to cover the second link line LL2 and the data line DL.

An anode electrode AE may be disposed on the second planarization layer PLN2 at a point defined as the emission area EA of the subpixel SP. The anode electrode AE may be connected to the second link line LL2 through an anode contact hole formed in the second planarization layer PLN2. Accordingly, the anode electrode AE may be electrically connected to the source electrode SE of the driving transistor DRT through the first link line LL1 and the second link line LL2.

Further, to define the emission area EA of the subpixel SP, a bank BANK may be disposed on the anode electrode AE. A portion of the bank BANK is open to expose a portion of the anode electrode AE. Accordingly, the open area of the bank BANK may correspond to the emission area EA.

A light emitting layer EL may be disposed on the anode electrode AE exposed to the open area of the bank BANK, and a cathode electrode CE may be disposed on the light emitting layer EL.

As described above, in the display device 100 of the disclosure, the conductive electrode TM may be formed to overlap the source electrode SE of the driving transistor DRT in the red subpixel SPr and the green subpixel SPg, so that the luminance variation range according to temperature may be increased. In contrast, in the blue subpixel SPb, the conductive electrode TM is positioned to not overlap the source electrode SE of the driving transistor DRT, so that the luminance variation range according to temperature is not increased.

As a result, it is possible to reduce a luminance deviation between subpixels according to temperature, thereby enhancing image quality.

Figure 9:
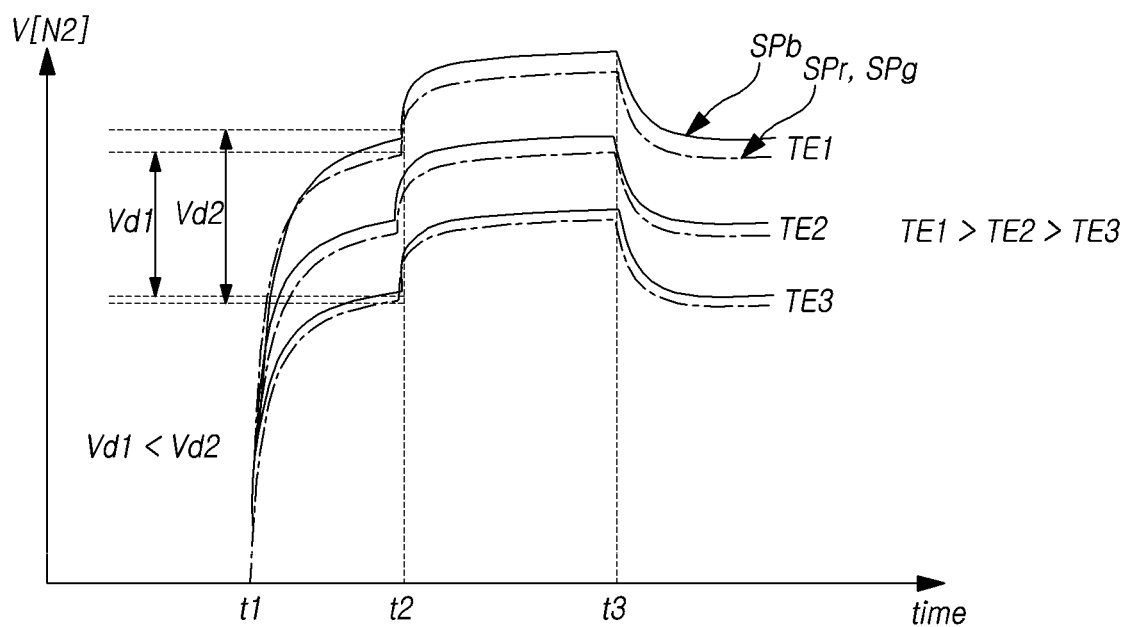
FIG. 9 is a graph illustrating variation characteristics of a gate voltage of a driving transistor in a display device according to embodiments of the disclosure.

FIG. 9 is a graph illustrating variation characteristics of a gate voltage of a driving transistor in a display device according to embodiments of the disclosure.

Referring to FIG. 9, a plurality of subpixel circuits as shown in FIG. 3 may be arranged on the display panel 110 of the display device 100 according to embodiments of the disclosure.

In this case, in the red subpixel SPr and the green subpixel SPg, the conductive electrode TM may be formed to overlap the source electrode SE of the driving transistor DRT but, in the blue subpixel SPb, the conductive electrode TM may be formed not to overlap the source electrode SE of the driving transistor DRT.

In this structure, if the data voltage Vdata is applied to the source electrode SE of the driving transistor DRT at a first time t1, the voltage of the source electrode SE is charged with the data voltage Vdata. In this case, the voltage of the gate electrode N2 of the driving transistor DRT rises to a difference between the data voltage Vdata and the threshold voltage according to the charged state of the source electrode SE.

Further, if the first switching transistor T1 is turned on at a second time t2, the gate electrode N2 of the driving transistor DRT rises to the level of the drain electrode and, if the first switching transistor T1 is turned off at a third time t3, it falls back.

Here, the voltage increase range of the gate electrode N2 of the driving transistor DRT may vary depending on the temperature. For example, when the display panel 110 is at a high temperature TE1, the voltage increase range of the gate electrode N2 of the driving transistor DRT may be larger than that when the display panel 110 is at a low temperature TE3.

In this case, since the conductive electrode TM is formed to overlap the source electrode SE of the driving transistor DRT in the red subpixel SPr and the green subpixel SPg, and the conductive electrode TM is formed not to overlap the source electrode SE of the driving transistor DRT in the blue subpixel SPb, the capacitance by the source electrode SE of the driving transistor DRT is greater in the red subpixel SPr and the green subpixel SPg than in the blue subpixel SPb.

As a result, the voltage increase range of the gate electrode N2 of the driving transistor DRT is greater in the blue subpixel SPb than in the red subpixel SPr and the green subpixel SPg.

In this case, the difference between the voltage at the high temperature TE1 and the voltage at the low temperature TE3 with respect to the gate electrode N2 of the driving transistor DRT may be referred to as a threshold voltage compensation rate. In other words, the threshold voltage compensation rate Vd2 of the driving transistor DRT disposed in the blue subpixel SPb is greater than the threshold voltage compensation rates Vd1 of the driving transistors DRT disposed in the red subpixel SPr and green subpixel SPg.

Therefore, as the luminance variation range according to temperature in the red subpixel SPr and the green subpixel SPg is greater than the luminance variation range in the blue subpixel SPb, the luminance deviation between the red subpixel SPr and the green subpixel SPg and the blue subpixel SPb may be mitigated, so that image quality may be enhanced.

FIGS. 10A and 10B show an experimental result for a luminance deviation of a display panel depending on temperature in a display device according to embodiments of the disclosure.

Referring to FIGS. 10A and 10B, the luminance of the subpixels SP constituting the display panel 110 in the display device 100 according to embodiments of the disclosure may vary according to the temperature of the display panel 110. For example, as in the case of FIG. 10A, as the temperature of the display panel 110 increases from 10 degrees to 40 degrees, the color coordinates of luminance represented by the subpixels SP decrease.

However, when the conductive electrodes TM of the red subpixel SPr and the green subpixel SPg are formed to overlap the source electrode SE of the driving transistor DRT as in the display device 100 of the disclosure, the luminance variation range according to temperature may be increased over the blue subpixel SPb due to an increase in the capacitance formed through the source electrode SE of the driving transistor DRT. As a result, the luminance deviation between the red subpixel SPr, the green subpixel SPg, and the blue subpixel SPb may be reduced, so that color coordinates of luminance may be formed to be close to the target as shown in FIGS. 10A and 10B.

Specifically, as the conductive electrodes TM of the red subpixel SPr and the green subpixel SPg are formed to overlap the source electrode SE of the driving transistor DRT, the luminance variation range of the red subpixel SPr according to temperature and the luminance variation range of the green subpixel SPg may be increased while the luminance variation range of the blue subpixel SPb may remain the same.

As a result, the luminance deviation between the red subpixel SPr, the green subpixel SPg, and the blue subpixel SPb may be reduced, so that image quality may be enhanced.

Embodiments of the disclosure described above are briefly described below.

A display device according to embodiments of the disclosure may comprise a display panel including a plurality of first subpixels, a plurality of second subpixels, and a plurality of third subpixels, a data driving circuit supplying a plurality of data voltages to the display panel, a gate driving circuit supplying a plurality of gate signals to the display panel, and a timing controller controlling the data driving circuit and the gate driving circuit. Each of the plurality of first subpixels and the plurality of second subpixels may include a first conductive electrode formed to overlap a first node of a first driving transistor driving a first light emitting element, over the first driving transistor, a data voltage applied to the first node of the first driving transistor. The plurality of third subpixels may include a second conductive electrode positioned to not overlap a first node of a second driving transistor driving a second light emitting element, over the second driving transistor, a data voltage applied to the first node of the second driving transistor.

The first subpixel may be a red subpixel, the second subpixel may be a green subpixel, and the third subpixel may be a blue subpixel.

The first driving transistor and the second driving transistor may be P-type low-temperature polysilicon transistors.

Each of the plurality of first subpixels and the plurality of second subpixels may include a first switching transistor having a gate electrode which receives a first scan signal, a drain electrode connected with a gate electrode of the first driving transistor, and a source electrode connected with a drain electrode of the first driving transistor, a second switching transistor having a gate electrode which receives a second scan signal, a source electrode which receives a data voltage, and a drain electrode connected with a source electrode of the first driving transistor, a third switching transistor having a gate electrode which receives a light emitting signal, a source electrode which receives a high-potential driving voltage through a driving voltage line, and a drain electrode connected with the source electrode of the first driving transistor, a fourth switching transistor having a gate electrode which receives the light emitting signal, a source electrode connected with the drain electrode of the first driving transistor, and a drain electrode connected with an anode electrode of the first light emitting element, a fifth switching transistor having a gate electrode which receives a fourth scan signal, a drain electrode which receives a stabilization voltage, and a source electrode connected with a gate electrode of the first driving transistor and a storage capacitor, a sixth switching transistor having a gate electrode which receives a third scan signal, a source electrode which receives a reset voltage, and a drain electrode connected with the anode electrode of the first light emitting element, and a seventh switching transistor having a gate electrode which receives a fifth scan signal, a source electrode which receives a bias voltage, and a drain electrode connected with the source electrode of the first driving transistor.

A first node of the first driving transistor may be the source electrode of the first driving transistor.

The first conductive electrode and the second conductive electrode may be a driving voltage line transferring a driving voltage.

The first conductive electrode may be formed of the same material as a gate electrode of the first driving transistor.

The second conductive electrode may be formed of the same material as a gate electrode of the second driving transistor.

The first conductive electrode may extend to an area overlapping an adjacent data line.

A display panel according to embodiments of the disclosure may comprise a plurality of first subpixels, a plurality of second subpixels, and a plurality of third subpixels, a plurality of data lines transferring a data voltage to the plurality of subpixels, and a plurality of gate lines transferring a gate signal to the plurality of subpixels. Each of the plurality of first subpixels and the plurality of second subpixels may include a first conductive electrode formed to overlap a first node of a first driving transistor driving a first light emitting element, over the first driving transistor, a data voltage applied to the first node of the first driving transistor. The plurality of third subpixels may include a second conductive electrode formed not to overlap a first node of a second driving transistor driving a second light emitting element, over the second driving transistor, a data voltage applied to the first node of the second driving transistor.

Each of the plurality of first subpixels and the plurality of second subpixels may include a substrate, a first buffer layer formed on the substrate, a first driving transistor formed on the first buffer layer, a first inter-layer insulation film formed on the first driving transistor, the first conductive electrode formed on the first inter-layer insulation film, a second buffer layer formed to cover the first conductive electrode and the first inter-layer insulation film, at least one switching transistor formed on the second buffer layer, a second inter-layer insulation film formed to cover the at least one switching transistor, a first planarization layer formed on the second inter-layer insulation film, a data line formed on the first planarization layer, a second planarization layer formed on the first planarization layer to cover the data line, and a first light emitting element formed on the second planarization layer.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure. Thus, the scope of the disclosure is not limited to the embodiments shown, but is to be accorded the widest scope consistent with the claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a display panel including a plurality of first subpixels, a plurality of second subpixels, and a plurality of third subpixels;
a data driving circuit configured to supply a plurality of data voltages to the display panel;
a gate driving circuit configured to supply a plurality of gate signals to the display panel; and
a timing controller configured to control the data driving circuit and the gate driving circuit,
wherein each of the plurality of first subpixels and the plurality of second subpixels includes a first conductive electrode positioned to overlap a first node of a first driving transistor which receives a data voltage over the first driving transistor for driving a first light emitting element, and wherein the plurality of third subpixels include a second conductive electrode positioned to not overlap a first node of a second driving transistor which receives another data voltage over the second driving transistor for driving a second light emitting element.

2. The display device of claim 1, wherein the first subpixel is a red subpixel, the second subpixel is a green subpixel, and the third subpixel is a blue subpixel.

3. The display device of claim 1, wherein the first driving transistor and the second driving transistor are P-type low-temperature polysilicon transistors.

4. The display device of claim 1, wherein each of the plurality of first subpixels and the plurality of second subpixels includes:
a first switching transistor having a gate electrode which receives a first scan signal, a drain electrode electrically connected with a gate electrode of the first driving transistor, and a source electrode electrically connected with a drain electrode of the first driving transistor;
a second switching transistor having a gate electrode which receives a second scan signal, a source electrode which receives a data voltage, and a drain electrode electrically connected with a source electrode of the first driving transistor;
a third switching transistor having a gate electrode which receives a light emitting signal, a source electrode which receives a high-potential driving voltage through a driving voltage line, and a drain electrode electrically connected with the source electrode of the first driving transistor;
a fourth switching transistor having a gate electrode which receives the light emitting signal, a source electrode electrically connected with the drain electrode of the first driving transistor, and a drain electrode electrically connected with an anode electrode of the first light emitting element;
a fifth switching transistor having a gate electrode which receives a fourth scan signal, a drain electrode which receives a stabilization voltage, and a source electrode electrically connected with a gate electrode of the first driving transistor and a storage capacitor;
a sixth switching transistor having a gate electrode which receives a third scan signal, a source electrode which receives a reset voltage, and a drain electrode electrically connected with the anode electrode of the first light emitting element; and
a seventh switching transistor having a gate electrode which receives a fifth scan signal, a source electrode which receives a bias voltage, and a drain electrode electrically connected with the source electrode of the first driving transistor.

5. The display device of claim 4, wherein the first node of the first driving transistor is the source electrode of the first driving transistor.

6. The display device of claim 1, wherein the first conductive electrode and the second conductive electrode correspond to a driving voltage line configured to transfer a driving voltage.

7. The display device of claim 1, wherein the first conductive electrode is formed of a same material as a gate electrode of the first driving transistor.

8. The display device of claim 1, wherein the second conductive electrode is formed of a same material as a gate electrode of the second driving transistor.

9. The display device of claim 1, wherein the first conductive electrode extends to an area overlapping an adjacent data line.

10. A display panel, comprising:
a plurality of first subpixels, a plurality of second subpixels, and a plurality of third subpixels;
a plurality of data lines configured to transfer a plurality of data voltages to the plurality of subpixels; and
a plurality of gate lines configured to transfer a plurality of gate signals to the plurality of subpixels,
wherein each of the plurality of first subpixels and the plurality of second subpixels includes a first conductive electrode positioned to overlap a first node of a first driving transistor which receives a data voltage over the first driving transistor for driving a first light emitting element, and
wherein the plurality of third subpixels includes a second conductive electrode positioned to not overlap a first node of a second driving transistor which receives another data voltage over the second driving transistor for driving a second light emitting element.

11. The display panel of claim 10, wherein the first subpixel is a red subpixel, the second subpixel is a green subpixel, and the third subpixel is a blue subpixel.

12. The display panel of claim 10, wherein each of the plurality of first subpixels and the plurality of second subpixels includes:
a substrate;
a first buffer layer formed on the substrate;
a first driving transistor formed on the first buffer layer;
a first inter-layer insulation film formed on the first driving transistor;
the first conductive electrode formed on the first inter-layer insulation film;
a second buffer layer formed to cover the first conductive electrode and the first inter-layer insulation film;
at least one switching transistor formed on the second buffer layer;
a second inter-layer insulation film formed to cover the at least one switching transistor;
a first planarization layer formed on the second inter-layer insulation film;
a data line formed on the first planarization layer;
a second planarization layer formed on the first planarization layer to cover the data line; and
a first light emitting element formed on the second planarization layer.

13. The display panel of claim 12, wherein a first node of the first driving transistor is the source electrode of the first driving transistor.

14. The display panel of claim 10, wherein the first conductive electrode and the second conductive electrode correspond to a driving voltage line configured to transfer a driving voltage.

15. The display panel of claim 10, wherein the first conductive electrode is formed of a same material as a gate electrode of the first driving transistor.

16. The display panel of claim 10, wherein the second conductive electrode is formed of a same material as a gate electrode of the second driving transistor.

17. The display panel of claim 12, wherein the first conductive electrode extends to an area overlapping an adjacent data line.

18. A display device, comprising:
a display panel including a plurality of subpixels, each subpixel of the plurality of subpixels including:
a light emitting element;
a thin film transistor electrically connected to the light emitting element, the thin film transistor having a source electrode, a gate electrode, and a drain electrode;
an insulation film on the gate electrode; and
a conductive electrode on the insulation film, the conductive electrode having a first portion, a second portion and a third portion spaced apart from each other;
wherein the first portion of the conductive electrode at least partially overlaps the drain electrode,
wherein the second portion of the conductive electrode at least partially overlaps the gate electrode,
wherein the third portion of the conductive electrode at least partially overlaps the source electrode, and
wherein a first capacitance is positioned between the third portion of the conductive electrode and the source electrode.

19. The display device of claim 18, further comprising a data line over the third portion of the conductive electrode and at least partially overlaps the source electrode and the third portion of the conductive electrode,
wherein a second capacitance is formed between the data line and the third portion of the conductive electrode, and
wherein a third capacitance is formed between the data line and the source electrode.

20. The display device of claim 19, wherein, in operation, the first, second, and third capacitance causes to increase a capacitance corresponding to the source electrode of the transistor.

21. The display device of claim 18, wherein the conductive electrode is configured to supply a driving voltage to the subpixel.

22. The display device of claim 18, wherein each subpixel is either a red subpixel or a green subpixel.

* * * * *